(12) United States Patent
Schunemann et al.

(10) Patent No.: US 12,302,542 B2
(45) Date of Patent: May 13, 2025

(54) METHOD OF PRODUCING LARGE EMI SHIELDED GaAs INFRARED WINDOWS

(71) Applicant: BAE SYSTEMS Information and Electronic Systems Integration Inc., Nashua, NH (US)

(72) Inventors: Peter G. Schunemann, Hollis, NH (US); Kevin T. Zawilski, Arlington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 222 days.

(21) Appl. No.: 18/073,179

(22) Filed: Dec. 1, 2022

(65) Prior Publication Data
US 2024/0188261 A1     Jun. 6, 2024

(51) Int. Cl.
*C30B 17/00* (2006.01)
*C09D 5/00* (2006.01)
(Continued)

(52) U.S. Cl.
CPC ........... *H05K 9/0005* (2013.01); *C09D 5/006* (2013.01); *C23C 16/306* (2013.01); *C23C 16/52* (2013.01);
(Continued)

(58) Field of Classification Search
CPC .... H05K 9/0005; C09D 5/006; C23C 16/306; C23C 16/52; C30B 17/00; C30B 29/42; C30B 29/602; C30B 35/002
See application file for complete search history.

(56) References Cited

U.S. PATENT DOCUMENTS 3,944,393 A * 3/1976 Schierding .............. C30B 11/14
117/223
4,778,731 A   10/1988 Kraatz
(Continued)

OTHER PUBLICATIONS

Sotoodeh, M., A. H. Khalid, and A. A. Rezazadeh. "Empirical low-field mobility model for III-V compounds applicable in device simulation codes." Journal of applied physics 87.6 dated Mar. 15, 2000): 2890-2900.
(Continued)

*Primary Examiner* — Robert M Kunemund
(74) *Attorney, Agent, or Firm* — Maine Cernota & Curran; Gary McFaline

(57) ABSTRACT

GaAs IR window slabs having largest dimensions that are greater than 8 inches, and preferably greater than 12 inches, are grown using the Horizontal Gradient Freeze (HGF) method. Heat extraction is simplified by using a shallow horizontal boat that is only slightly deeper than the desired window thickness, thereby enabling growth of large slabs while also minimizing material waste and fabrication cost as compared to slicing and shaping thick plates from large, melt-grown boules. Single crystal seeds can be used to optimize the final orientation of the slabs and minimize secondary nucleation, thereby maximizing yield. A conductive doped GaAs layer can be applied to the IR window slab to provide EMI shielding. The temperature gradient during HGF can be between 1° C./cm and 3° C./cm, and the directional solidification can be at a rate of between 0.25 mm/h and 2.5 mm/h.

18 Claims, 4 Drawing Sheets

(51) Int. Cl.
*C23C 16/30* (2006.01)
*C23C 16/52* (2006.01)
*C30B 29/42* (2006.01)
*C30B 29/60* (2006.01)
*C30B 35/00* (2006.01)
*H05K 9/00* (2006.01)

(52) U.S. Cl.
CPC .............. *C30B 17/00* (2013.01); *C30B 29/42* (2013.01); *C30B 29/602* (2013.01); *C30B 35/002* (2013.01)

(56) References Cited

U.S. PATENT DOCUMENTS

| | | | |
|---|---|---|---|
| 4,939,043 A | 7/1990 | Biricik | |
| 5,007,979 A * | 4/1991 | Mizuniwa | C30B 29/42 |
| | | | 117/900 |
| 5,173,443 A | 12/1992 | Biricik | |
| 5,824,418 A | 10/1998 | Tully | |
| 10,156,023 B2 | 12/2018 | Schunemann | |
| 2003/0172870 A1* | 9/2003 | Liu | C30B 29/40 |
| | | | 117/200 |
| 2010/0219509 A1 | 9/2010 | He | |
| 2011/0256693 A1 | 10/2011 | D'Evelyn | |
| 2012/0031324 A1 | 2/2012 | Hiromura | |
| 2012/0097092 A1* | 4/2012 | Zhu | C30B 11/002 |
| | | | 117/61 |
| 2012/0255484 A1* | 10/2012 | Zhu | C30B 29/08 |
| | | | 117/78 |
| 2014/0162441 A1 | 6/2014 | Preble | |
| 2017/0362739 A1 | 12/2017 | Kajimoto | |

OTHER PUBLICATIONS

Stromberg, A., Bhargava, P., Xu, Z., Lourdudoss, S. and Sun, Y. (2021), Direct Heteroepitaxy and Selective Area Growth of GaP and GaAs on Si by Hydride Vapor Phase Epitaxy. Phys. Status Solidi A, dated Oct. 17, 2020 218.3.

Jeremy B. Reeves et al., Method of Optimizing The EMI Shielding and Infrared Transparency of GaAs IR Windows, patent application, filed Dec. 1, 2022, U.S. Appl. No. 18/072,931.

Peter G. Schunemann et al., Method of Producing Large GaAs and GaP Infrared Windows, patent application, filed Dec. 1, 2022, U.S. Appl. No. 18/073,177.

Peter G. Schunemann et al., Method of Producing Large EMI Shielded GaAs and GaP Infrared Windows, patent application, filed Dec. 1, 2022, U.S. Appl. No. 18/073,183.

Peter G. Schunemann et al., Method of Producing Large GaAs and GaP Infrared Windows, patent application, filed Dec. 1, 2022, U.S. Appl. No. 18/073,228.

Notice of Allowance for U.S. Appl. No. 18/073,228 mail date Sep. 30, 2024, 15 pages.

* cited by examiner

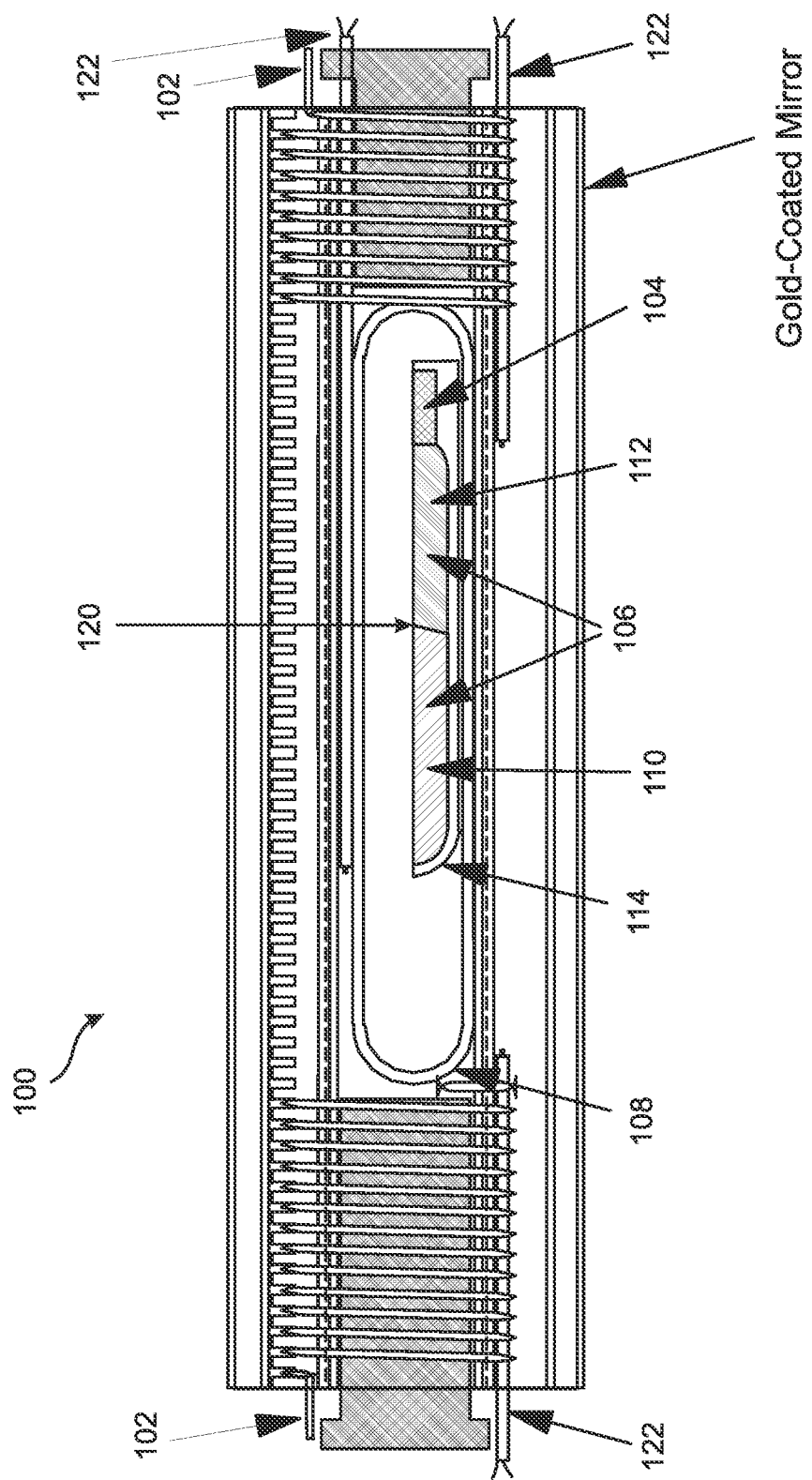

METHOD OF PRODUCING LARGE EMI SHIELDED GaAs INFRARED WINDOWS

RELATED APPLICATIONS

This application is related to co-pending US application 18,072,931 entitled METHOD OF OPTIMIZING THE EMI SHIELDING AND INFRARED TRANSPARENCY OF GaAs IR WINDOWS with first inventor Jeremy B. Reeves, filed on Dec. 1, 2022, U.S. application Ser. No. 18/073,177 entitled METHOD OF PRODUCING LARGE GaAs AND GaP INFRARED WINDOWS with first inventor Peter G. Schunemann, filed on Dec. 1, 2022, U.S. application Ser. No. 18/073,228 entitled METHOD OF PRODUCING LARGE GaAs AND GaP INFRARED WINDOWS with first inventor Peter G. Schunemann, filed on Dec. 1, 2022, and U.S. application Ser. No. 18/073,183 entitled METHOD OF PRODUCING LARGE EMI SHIELDED GaAs AND GaP INFRARED WINDOWS with first inventor Peter G. Schunemann, filed on Dec. 1, 2022, all of which are also by the present Applicant, all of which are herein incorporated by reference in their entirety for all purposes.

FIELD

The disclosure relates to optical windows, and more particularly, to optical windows that are transparent to infrared light and are more than eight inches in diameter.

BACKGROUND

A growing number of optical systems incorporate infrared (IR) sensors and/or lasers that operate over a wide range of wavelengths between one and twelve microns. Accordingly, the platforms on which these devices are mounted require optical windows that are transparent over this broad spectral range. A growing number of these applications require windows having a largest diameter of more than 8 inches, and in some cases more than 12 inches, which in turn requires that the window material must be relatively hard, so that the window will be structurally competent without being unduly thick.

Furthermore, as electronics and sensor systems become more highly and densely integrated, the need has increased for electromagnetic shielding (EMI) of components. For systems that require optical windows, it has therefore become increasingly necessary to provide EMI shielded windows, i.e. windows that have very low absorption at wavelengths of interest, while also shielding the window aperture against electromagnetic penetration.

The material that is most commonly used to manufacture large IR windows is hot-isostatic-pressed (HIP) polycrystalline Zinc Sulfide (ZnS), due to the broad spectral transparency of ZnS, because the HIP process is relatively quick, and because the window size when using this polycrystalline material is limited only by the size of the high-pressure containment vessel in which the HIP is applied. However, the mechanical properties of HIP ZnS are only adequate at best, which can sometimes limit application of the material to large IR windows, such as IR windows greater than 12 inches in diameter. Furthermore, HIP ZnS is generally produced by first growing crystalline ZnS by CVD, and then applying the additional step of HIP, which of course adds to the cost of the final product.

When EMI shielding is required, HIP ZnS windows generally rely on a metallic grid coating deposited onto a window surface. However, the metal lines in the grid coating are opaque to IR radiation, obscuring portions of the window, and can significantly reduce the optical transmission of the window, especially at large angles of incidence. Additionally, the grid pattern can lead to diffraction of IR waves passing through the material, which can have substantial negative impacts on system performance.

In many cases, to provide EMI shielding, it would be preferable to deposit a thin conducting layer of a doped semiconductor onto a surface of an IR window, as an alternative to a metallic grid. Unfortunately, is nearly impossible to dope ZnS to produce a conductive EMI layer, due to its tendency to form compensating defects that neutralize dopants to maintain their insulating properties. This problem can be circumvented by preparing a separate, thin wafer of a doped semiconductor such as GaAs, and then attaching the wafer to the surface of an HIP ZnS window by optical bonding. However, this approach can be time consuming, difficult, and expensive.

As is discussed in more detail in co-pending U.S. application Ser. No. 18/072,931, filed on Dec. 1, 2022, which is also by the present Applicant and is incorporated herein by reference, IR windows made from gallium arsenide (GaAs) or gallium phosphate (GaP) are a potential alternative to windows made from HIP ZnS.

GaAs is highly transparent from 1.7 to 12 microns, exhibits about 3.5× higher hardness compared to HIP ZnS, and can be easily and precisely doped to control the electrical properties of thin epitaxially applied conducting layers.

Gallium phosphide, GaP, is highly transparent between 0.7 and 8.5 microns, and does not absorb strongly until nearly 11 microns. It has an even higher mechanical strength than GaAs, and substantially higher visible and near-IR transparency than GaAs, at the expense of reduced transparency at longer wavelengths. Like GaAs, GaP can also be easily and precisely doped to control the electrical properties of thin, epitaxially applied conducting layers.

Relatively small, thin wafers of GaAs and GaP have been widely used in the integrated circuit (IC) and photovoltaic (i.e. solar cell) industries. GaAs and GaP substrate wafers are cut from single crystals grown by melt techniques, primarily Czochralski (Cz) or Vertical Gradient Freeze (VGF) growth. IC's, solar cells, and other multi-layer device structures are typically then grown on these substrates by epitaxial methods such as Molecular Beam Epitaxy (MBE) or Metal Organic Vapor Phase Epitaxy (MOVPE) with precisely controlled layer thicknesses. The total device structures are limited to thicknesses of several microns, and scaling to thicknesses beyond this is precluded by the very slow growth rates achievable by these epitaxial techniques.

The Cz and VGF techniques used to produce GaAs and GaP substrates for most IC and photovoltaic applications could also be used to produce IR windows by slicing much thicker slabs (several millimeters) from the single crystal boules grown from melt.

However, boules of GaAs that are grown from melt by VGF are generally limited to eight inches in diameter or less, while boules of GaP are generally limited to only 3 inches in diameter, and even these are not widely available. Furthermore, scaling the existing GaAs melt-growth techniques to larger diameters would be extremely challenging, for both GaAs and GaP, due to the difficulty of extracting more and more heat while controlling the interface shape and crystal quality during growth from ever increasing melt sizes. Managing the high equilibrium vapor pressure during growth, particularly for GaP, becomes problematic at larger boule diameters.

This inability to produce larger diameter boules has prevented the use of GaAs and GaP as slab materials for large IR windows, e.g. for windows having a largest dimension that is greater than 8 inches, and up to 12 inches and more.

What is needed, therefore, is a method of making GaAs and GaP slabs having largest dimensions that are greater than 8 inches, and preferably equal to 12 inches or more, wherein the slabs are sufficiently thick to be structurally competent when used as IR windows.

SUMMARY

The present disclosure is a method of making GaAs slabs having largest dimensions that are greater than 8 inches, and preferably equal to 12 inches or more, wherein the slabs are sufficiently thick to be structurally competent when used as IR windows. More specifically the present disclosure teaches using the Horizontal Gradient Freeze (HGF) method to make GaAs slabs for IR windows.

Using the Horizontal Gradient Freeze (HGF) technique according to the present disclosure to grow wide, flat, near-net-shape plates by directional solidification simplifies heat extraction through the use of a shallow horizontal boat that is only slightly deeper than the desired window thickness. The disclosed method also minimizes the material waste and fabrication cost, as compared to slicing and shaping thick plates from large cylindrical boules grown from melt.

The use of single crystal seeds according to embodiments of the present disclosure optimizes the final orientation and minimizes secondary nucleation to maximize yield.

The HGF furnace design according to the present disclosure features a "boat", such as a pyrolytic boron nitride (PBN) boat, that includes a seed crystal region at a proximal end thereof in liquid communication with a crystal growing region that is distal to the seed crystal region. The crystal growing region has a largest dimension that is greater than eight inches, and in embodiments 12 inches or more. In various embodiments the crystal growing region is substantially equal in size and shape to the desired slab dimensions, with these dimensions being only slightly increased to allow for grinding and polishing the crystal to form the desired slab.

The furnace further includes at least two independently controlled heating elements that are horizontally separated from each other and in close thermal communication with the furnace interior.

Growing the GaAs crystal includes placing a seed crystal of GaAs in the seed crystal region of the boat, and placing a polycrystalline "charge" of the same material in the crystal growing region of the boat. The boat is then placed within the interior of the furnace. In embodiments, the boat is sealed within an ampoule, and then the ampoule is placed within the furnace.

The heating elements are then activated to raise the internal temperature of the furnace, while maintaining a small thermal gradient across the interior such that the temperature of the crystal growing region of the boat remains always slightly higher than the temperature of the seed crystal region.

Once the temperature within the furnace has been raised sufficiently to melt the polycrystalline charge, along with a distal portion of the seed crystal, the temperature is slowly lowered, while still maintaining the temperature gradient, so that a solid/liquid interface slowly shifts distally from the seed crystal region across the crystal growing region as the solidifying charge material attaches to and extends the seed crystal into the crystal growing region. In embodiments, the resulting crystal substantially fills the crystal growing region.

During the crystal growth process, the thermal gradients and cooling rate are optimized to control the solid-liquid interface shape, while minimizing vapor transport. In embodiments, a controlled arsenic or inert gas over-pressure is applied to the material within the boat.

Once the grown crystal has cooled and has been removed from the boat, it is formed into the desired IR window slab, for example by cutting, grinding, and polishing the grown crystal.

In some embodiments, EMI shielded GaAs windows are produced by applying a conductive doped GaAs layer to the window slab in a subsequent vacuum deposition step, for example using an epitaxial method such as molecular beam epitaxy (MBE), metal-organic vapor phase epitaxy (MOVPE), metallo-organic chemical vapor deposition (MOCVD, or organo-metallic vapor phase epitaxy (OMVPE).

A first general aspect of the present disclosure is a method of producing a GaAs slab having a largest dimension that is greater than eight inches, the slab being suitable for forming an infrared (IR) transparent window having a largest dimension that is greater than eight inches. The method includes providing a boat having a seed crystal region in contact with a crystal growing region, the crystal growing region having a largest dimension that is greater than eight inches, placing a single crystal of GaAs as a seed crystal in the seed crystal region of the boat, placing a polycrystalline charge of GaAs in the crystal growing region, placing the boat within an interior of a horizontal furnace, at least two heating elements of the horizontal furnace being configured to separately control temperatures of the seed crystal region and the crystal growing region, causing the heating elements to establish and maintain a horizontal temperature gradient across the interior of the furnace, said temperature gradient causing the seed crystal to be lower in temperature than the polycrystalline charge, heating the interior of the furnace while maintaining said temperature gradient until the polycrystalline charge and a first portion of the seed crystal in contact with the polycrystalline charge are melted, a second portion of the seed crystal remaining solid, a solid/liquid interface being formed between the first and second portions of the seed crystal, gradually cooling the interior of the furnace while maintaining the horizontal temperature gradient within the interior, so that the solid/liquid interface moves continuously across the crystal growing region, thereby causing directional solidification of the GaAs whereby the solidifying GaAs at the solid/liquid interface attaches to and extends the seed crystal, removing the boat from the furnace, removing the grown crystal from the crystal growing region of the boat, and forming the GaAs IR window slab from the grown crystal.

In embodiments, the crystal growing region has a largest dimension of at least 12 inches.

In any of the above embodiments, the growing region of the boat can be substantially rectangular.

In any of the above embodiments, a size and shape of the crystal growing region can approximate a desired size and shape of the GaAs slab.

In any of the above embodiments, the temperature gradient can be between 1° C./cm and 3° C./cm.

In any of the above embodiments, the boat can be a pyrolytic boron nitride (PBN) boat.

In any of the above embodiments, the directional solidification can be at a rate of between 0.25 mm/h and 2.5 mm/h.

Any of the above embodiments can further include encapsulating the boat in an ampoule before placing the boat within an interior of the horizontal furnace. In some of these embodiments, the ampoule is a quartz ampoule.

Any of the above embodiments can further include applying a conductive doped GaAs layer to the IR window slab. In some of these embodiments the conductive doped GaAs layer is applied to the IR window slab by a vacuum deposition process. And in some of these embodiments the vacuum deposition process is LP-HVPE.

Any of the above embodiments can further include maintaining an arsenic or inert gas over-pressure over the boat while the furnace interior is heated and cooled.

A second general aspect of the present disclosure is an apparatus for growing a GaAs slab having a largest dimension that is greater than eight inches, the slab being suitable for forming an infrared (IR) transparent window having a largest dimension that is greater than eight inches. The apparatus includes a boat having a seed crystal region in contact with a crystal growing region, the crystal growing region having a largest dimension that is greater than eight inches, a horizontal furnace having a furnace interior configured to receive and surround the boat while the boat is oriented horizontally, at least two heating elements configured to separately control temperatures of the seed crystal region and the crystal growing region, a plurality of temperature sensors providing temperature measurements at a plurality of locations within the furnace, and a controller in electrical communication with the heating elements and with the temperature sensors, the controller being configured to cause the heating elements to heat and then to cool the interior of the furnace, while establishing and maintaining a horizontal temperature gradient across the interior of the furnace, such that a temperature of the crystal growing region of the boat within the interior of the furnace is caused to be always higher than a temperature of the seed crystal region throughout the heating and cooling.

In any of the above embodiments, the crystal growing region can have a largest dimension of at least 12 inches. In some of these embodiments, the growing region of the boat is substantially rectangular. In any of these embodiments, a size and shape of the crystal growing region can approximate a desired size and shape of the GaAs slab. In any of these embodiments, the boat can be a pyrolytic boron nitride (PBN) boat. And any of these embodiments can further include an ampoule configured to receive and contain the boat.

A third general aspect of the present disclosure is an infrared window comprising a GaAs slab having a slab largest dimension that is greater than eight inches, where the slab being formed by placing a seed crystal in a seed crystal region of a boat, said seed crystal region being in contact with a crystal growing region of the boat, the crystal growing region having a largest dimension that is greater than eight inches, placing a polycrystalline charge of GaAs in the crystal growing region, heating the boat while maintaining a horizontal temperature gradient across the boat, whereby the seed crystal region is maintained at a lower temperature than the crystal growing region, the polycrystalline charge and a first portion of the seed crystal in contact with the polycrystalline charge being thereby melted while a second portion of the seed crystal remains solid, and gradually cooling the boat while maintaining the horizontal temperature gradient, so that a solid/liquid interface of the polycrystalline charge moves continuously across the crystal growing region, thereby causing directional solidification of the GaAs whereby the solidifying GaAs at the solid/liquid interface attaches to and extends the seed crystal.

In embodiments, the slab largest dimension is greater than twelve inches.

Any of the above embodiments can further include an electrically conductive layer of doped GaAs applied to the slab.

And any of the above embodiments can further include an anti-reflective coating applied to the slab.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1A is a cross-sectional side view of an HGF furnace that can be used in embodiments of the present disclosure to grow a GaAs IR window slab;

DETAILED DESCRIPTION

The present disclosure is a method of making GaAs slabs having largest dimensions that are greater than 8 inches, and in embodiments equal to 12 inches or more, wherein the slabs are sufficiently thick to be structurally competent when used as IR windows. More specifically the present disclosure teaches using the Horizontal Gradient Freeze (HGF) method to make GaAs slabs for IR windows.

Figure 1B:
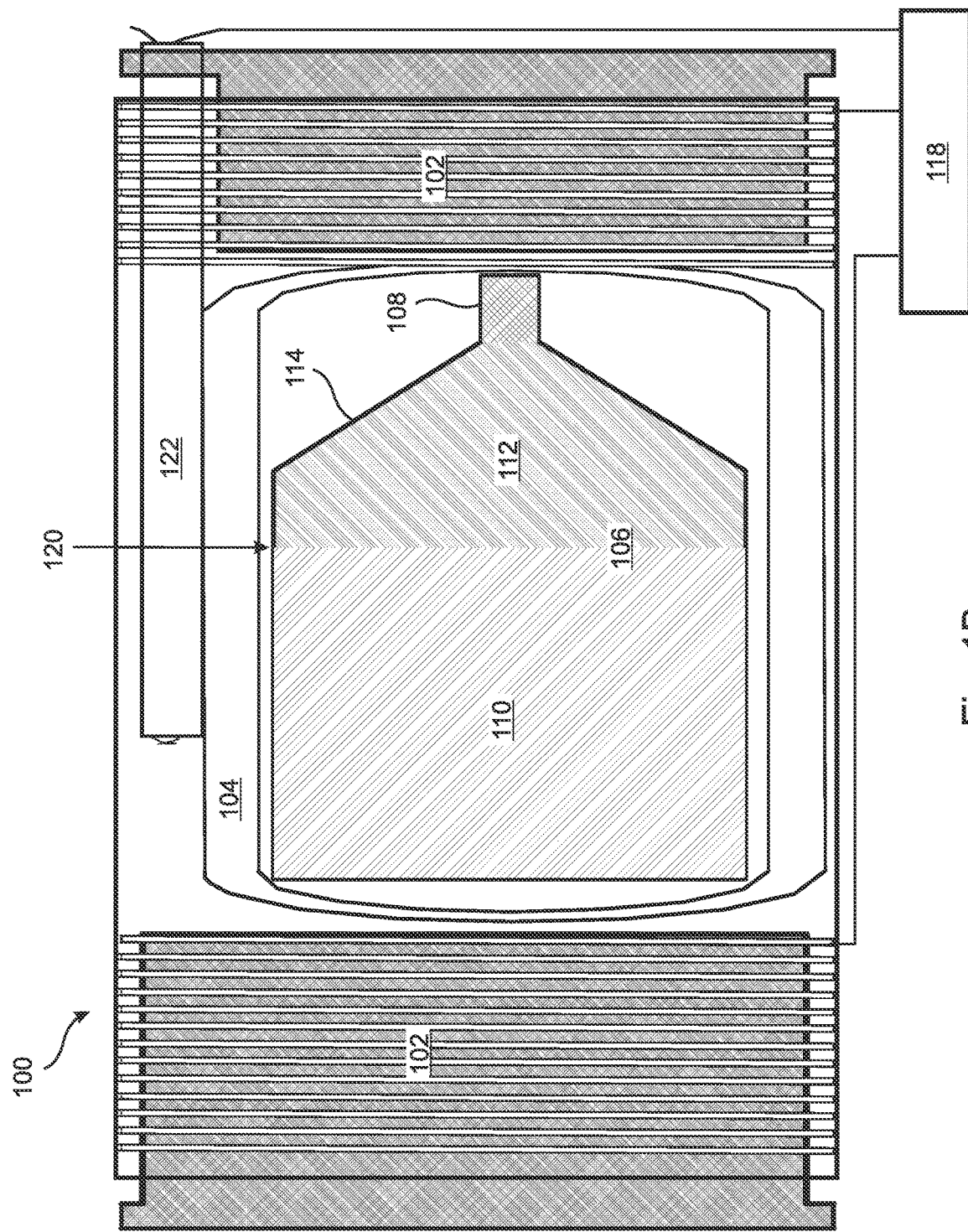
FIG. 1B is a top view of the HGF furnace of FIG. 1A.

With reference to the side view of FIG. 1A and the top view of FIG. 1B, in embodiments of the present disclosure the HGF furnace 100 features two or more heating elements 102 that create two corresponding heating zones, namely a hot zone on the left, and a cold zone on the right. A "boat" 114, such as a pyrolytic boron nitride (PBN) boat 114, includes a seed well 104 at the cold end of the boat 114 containing a seed crystal in contact with a crystal growing region 106 of the boat 114. The crystal growing region 106 has a largest dimension that is greater than eight inches. In embodiments, the largest dimension is equal to 12 inches or more. In various embodiments, the crystal growing region is substantially equal in size and shape to the desired slab dimensions, for example being only slightly larger in size so as to allow for eventual grinding and polishing of the slab.

Also shown in FIG. 1B is a controller 118 that is in electrical communication with the heating elements 102 and with temperature sensors 122, such as thermocouples, that extend within the furnace, the controller 118 being thereby able to measure and to regulate the temperature at a plurality of locations within the furnace 100.

Figure 1C:
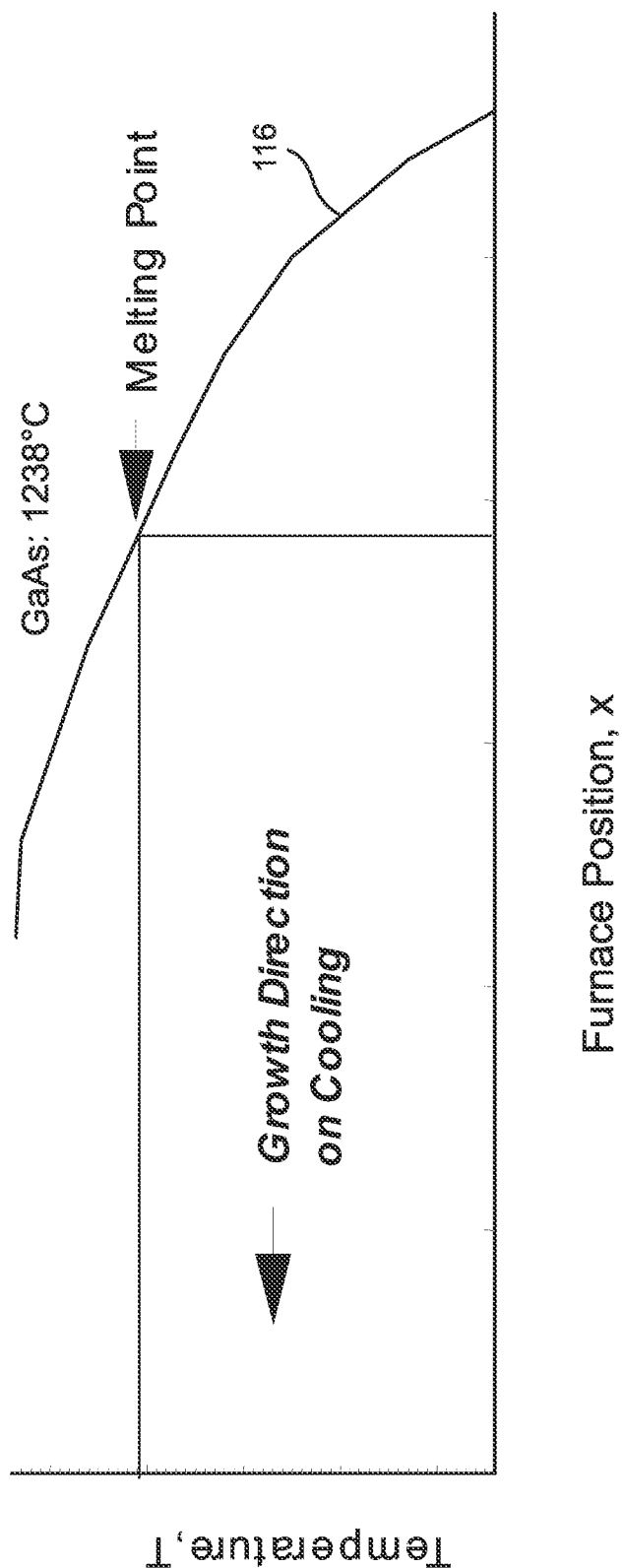
FIG. 1C is a graph that illustrates a temperature gradient that is maintained within the HGF of FIGS. 1A and 1B during the horizontal growth of a GaAs crystal.

FIG. 1C is a graph that illustrates an axial temperature gradient 116 that is maintained in an embodiment within the horizontal furnace 100 during the horizontal growth of the GaAs crystal 112.

Figure 2:
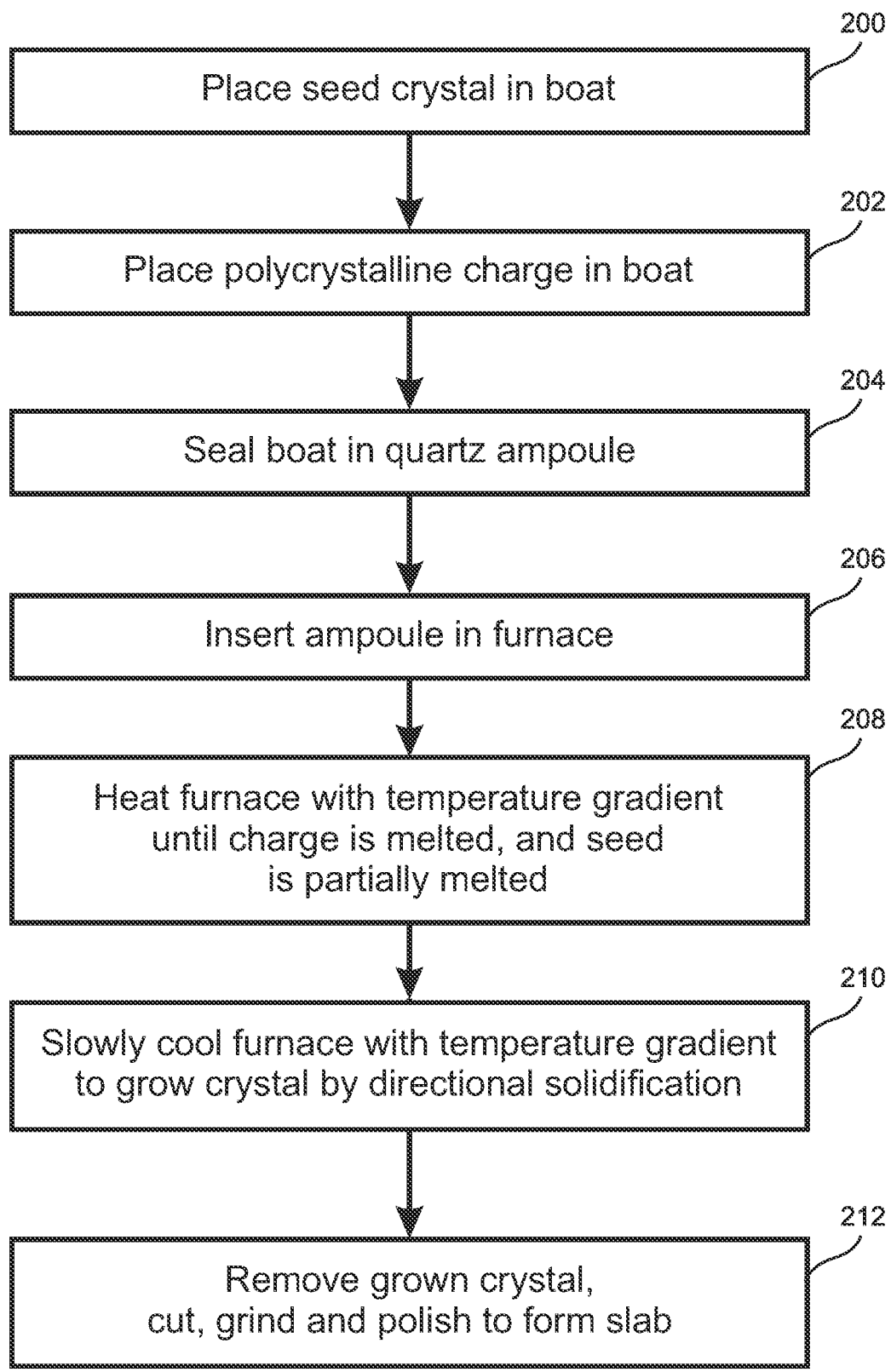
FIG. 2 is a flow diagram that illustrates an embodiment of the present disclosure

With reference to FIG. 2, growing the GaAs crystal according to the present disclosure includes 200 placing a seed crystal of GaAs in the seed well 104 of the boat 114 and placing 202 a polycrystalline "charge" of GaAs 202 in the crystal growing region 106 of the boat 114. The boat is then inserted 206 into the horizontal furnace 100. In embodiments, the boat 114 is first encapsulated and sealed 204 within an ampoule 108, such as a quartz ampule 108, and the ampoule is inserted 206 into the furnace 100.

The temperature within the furnace 100 is gradually raised 208 by the two heating elements 102, while maintaining a shallow axial temperature gradient 116 (typically 1-3° C./cm) across the boat 114, such that that melting of the GaAs charge 106 begins at the tail end of the boat (furthest from the seed well 104) until the charge 106 is fully melted and the seed crystal in the seed well 104 is partially melted. The furnace 100 is then slowly cooled 210, and crystallization 112 occurs by directional solidification of the melted charge material, in embodiments at rates of 0.25-2.5 mm/h, followed by cooling of the boat 114 to room temperature once the grown crystal 112 is fully solidified. The grown crystal can then be removed from the boat, and used to form the desired IR window slab 212, for example by cutting, grinding, and polishing the grown crystal.

The disclosed method enables precise control of the temperature gradient 116 within the furnace 100, thereby allowing the shape of the solid-liquid interface 120 between melted GaS 110 and solidified GaAs crystal 112 in the crystal growing region 106 to be controlled while vapor transport is minimized. In embodiments, a controlled arsenic or inert gas over-pressure is maintained over the boat 114.

Using the Horizontal Gradient Freeze (HGF) technique according to the present disclosure to grow wide, flat, near-net-shape single crystal plates by directional, horizontal solidification simplifies heat extraction through the use of a shallow horizontal boat 114 that is only slightly deeper than the desired window thickness. The disclosed method also minimizes the material waste and fabrication cost, as compared to slicing and shaping thick plates from large cylindrical boules grown from melt.

The use of single seed crystals according to embodiments of the present disclosure optimizes the final orientation of the grown crystal, and minimizes secondary nucleation, thereby maximizing yield.

In some embodiments, EMI shielded GaAs windows are produced by applying a conductive doped GaAs layer to the window slab in a subsequent vacuum deposition step, for example using an epitaxial method such as molecular beam epitaxy (MBE), metal-organic vapor phase epitaxy (MOVPE), metallo-organic chemical vapor deposition (MOCVD, or organo-metallic vapor phase epitaxy (OMVPE).

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. A method of producing a GaAs slab having a largest dimension that is greater than eight inches, the slab being suitable for forming an infrared (IR) transparent window having a largest dimension that is greater than eight inches, the method comprising:
   providing a boat having a seed crystal region in contact with a crystal growing region, the crystal growing region having a largest dimension that is greater than eight inches;
   placing a single crystal of GaAs as a seed crystal in the seed crystal region of the boat;
   placing a polycrystalline charge of GaAs in the crystal growing region;
   placing the boat within an interior of a horizontal furnace, at least two heating elements of the horizontal furnace being configured to separately control temperatures of the seed crystal region and the crystal growing region;
   causing the heating elements to establish and maintain a horizontal temperature gradient across the interior of the furnace, said temperature gradient causing the seed crystal to be lower in temperature than the polycrystalline charge;
   heating the interior of the furnace while maintaining said temperature gradient until the polycrystalline charge and a first portion of the seed crystal in contact with the polycrystalline charge are melted, a second portion of the seed crystal remaining solid, a solid/liquid interface being formed between the first and second portions of the seed crystal;
   gradually cooling the interior of the furnace while maintaining the horizontal temperature gradient within the interior, so that the solid/liquid interface moves continuously across the crystal growing region, thereby causing directional solidification of the GaAs whereby the solidifying GaAs at the solid/liquid interface attaches to and extends the seed crystal;
   removing the boat from the furnace;
   removing the grown crystal from the crystal growing region of the boat; and
   forming the GaAs IR window slab from the grown crystal.

2. The method of claim 1, wherein the crystal growing region has a largest dimension of at least 12 inches.

3. The method of claim 1, wherein the growing region of the boat is substantially rectangular.

4. The method of claim 1, wherein a size and shape of the crystal growing region approximate a desired size and shape of the GaAs slab.

5. The method of claim 1, wherein the temperature gradient is between 1° C./cm and 3° C./cm.

6. The method of claim 1, wherein the boat is a pyrolytic boron nitride (PBN) boat.

7. The method of claim 1, wherein the directional solidification is at a rate of between 0.25 mm/h and 2.5 mm/h.

8. The method of claim 1, further comprising encapsulating the boat in an ampoule before placing the boat within an interior of the horizontal furnace.

9. The method of claim 1, further comprising applying a conductive doped GaAs layer to the IR window slab.

10. The method of claim 9, wherein the conductive doped GaAs layer is applied to the IR window slab by a vacuum deposition process.

11. The method of claim 10, wherein the vacuum deposition process is LP-HVPE.

12. The method of claim 1, further comprising maintaining an arsenic or inert gas over-pressure over the boat while the furnace interior is heated and cooled.

13. Apparatus for growing a GaAs slab having a largest dimension that is greater than eight inches, the slab being suitable for forming an infrared (IR) transparent window having a largest dimension that is greater than eight inches, the apparatus comprising:

a boat having a seed crystal region in contact with a crystal growing region, the crystal growing region having a largest dimension that is greater than eight inches;

a horizontal furnace having a furnace interior configured to receive and surround the boat while the boat is oriented horizontally;

at least two heating elements configured to separately control temperatures of the seed crystal region and the crystal growing region;

a plurality of temperature sensors providing temperature measurements at a plurality of locations within the furnace; and a controller in electrical communication with the heating elements and with the temperature sensors, the controller being configured to cause the heating elements to heat and then to cool the interior of the furnace, while establishing and maintaining a horizontal temperature gradient across the interior of the furnace, such that a temperature of the crystal growing region of the boat within the interior of the furnace is caused to be always higher than a temperature of the seed crystal region throughout the heating and cooling.

14. The apparatus of claim 13, wherein the crystal growing region has a largest dimension of at least 12 inches.

15. The apparatus of claim 13, wherein the growing region of the boat is substantially rectangular.

16. The apparatus of claim 13, wherein a size and shape of the crystal growing region approximate a desired size and shape of the GaAs slab.

17. The apparatus of claim 13, wherein the boat is a pyrolytic boron nitride (PBN) boat.

18. The apparatus of claim 13, further comprising an ampoule configured to receive and contain the boat.

* * * * *